US010044288B2

United States Patent
Dong et al.

(10) Patent No.: US 10,044,288 B2
(45) Date of Patent: Aug. 7, 2018

(54) COMBINED INVERTER

(71) Applicant: Sungrow Power Supply Co., Ltd., Hefei, Anhui (CN)

(72) Inventors: Puyun Dong, Anhui (CN); Yonghong Li, Anhui (CN); Qu'e Cai, Anhui (CN); Guanjun Wang, Anhui (CN)

(73) Assignee: SUNGROW POWER SUPPLY CO., LTD., Anhui (CN)

( * ) Notice: Subject to any disclaimer, the term of this patent is extended or adjusted under 35 U.S.C. 154(b) by 15 days.

(21) Appl. No.: 15/194,904

(22) Filed: Jun. 28, 2016

(65) Prior Publication Data
US 2017/0257035 A1    Sep. 7, 2017

(30) Foreign Application Priority Data

Mar. 2, 2016  (CN) .......................... 2016 1 0118508

(51) Int. Cl.
*H02M 7/00*    (2006.01)
*H01R 31/06*   (2006.01)
(Continued)

(52) U.S. Cl.
CPC ............ *H02M 7/003* (2013.01); *H01R 31/06* (2013.01); *H05K 5/0013* (2013.01);
(Continued)

(58) Field of Classification Search
None
See application file for complete search history.

(56) References Cited

U.S. PATENT DOCUMENTS 5,616,968 A     4/1997 Fuji et al.
2002/0197893 A1  12/2002 Hiroyuki et al.
(Continued)

FOREIGN PATENT DOCUMENTS

CN    201821282 U    5/2011
CN    102177048 A    9/2011
(Continued)

OTHER PUBLICATIONS

Extended European Search Report for corresponding Application No. 16175486.6-1809; dated Aug. 1, 2017.
(Continued)

*Primary Examiner* — Dimary Lopez Cruz
*Assistant Examiner* — Zhengfu Feng
(74) *Attorney, Agent, or Firm* — Cantor Colburn LLP

(57) ABSTRACT

A combined inverter is arranged, which includes at least two separate box bodies connected detachably, all components of the combined inverter are placed into the box bodies separately, and at least one electrical connection terminal is arranged outside each of the box bodies, and the electrical connection terminal of one of the box bodies is capable of being connected to the electrical connection terminal of another of the box bodies. Therefore, a structure connection and an electrical connection of the combined inverter is achieved, weight of the whole combined inverter is dismantled effectively on the premise of ensuring normal operation of the combined inverter, construction difficult of installation and transportation is reduced, and the combined inverter has high applicability even when having high power.

9 Claims, 3 Drawing Sheets

(51) Int. Cl.
*H05K 5/00* (2006.01)
*H05K 5/02* (2006.01)
*H05K 7/14* (2006.01)

(52) U.S. Cl.
CPC ......... *H05K 5/0021* (2013.01); *H05K 5/0247* (2013.01); *H05K 7/14* (2013.01); *H05K 7/1401* (2013.01)

(56) References Cited

U.S. PATENT DOCUMENTS

| | | | |
|---|---|---|---|
| 2011/0176281 A1 | 7/2011 | Ikemoto et al. | |
| 2011/0181435 A1* | 7/2011 | Sata | G06F 1/26 340/815.4 |
| 2014/0293553 A1* | 10/2014 | Stanelli | H01L 31/0485 361/730 |
| 2014/0301041 A1 | 10/2014 | Kitanaka | |

FOREIGN PATENT DOCUMENTS

| | | |
|---|---|---|
| CN | 103988411 A | 8/2014 |
| CN | 204103253 U | 1/2015 |
| EP | 2506381 A1 | 10/2012 |

OTHER PUBLICATIONS

SIPO First Office Action corresponding to Application No. 201610118508.0; dated Dec. 20, 2017.

\* cited by examiner

COMBINED INVERTER

CROSS REFERENCE OF RELATED APPLICATION

The present application claims the priority to Chinese Patent Application No. 201610118508.0, titled "COMBINED INVERTER", filed on Mar. 2, 2016 with the State Intellectual Property Office of the People's Republic of China, the content of which is incorporated herein by reference in its entirety.

FIELD

The present disclosure relates to the field of power supply device technology, and particularly to a combined inverter.

BACKGROUND

An inverter is a device for converting a direct current into an alternating current (a sine wave of 220V and 50 Hz in general), which includes an inverter unit, a filtering unit, a control unit, a converging unit, a booster unit, a communication unit, a switch fitting and other components, thereby achieving the objective to convert the direct current into the alternating current in coordination with all components.

A common inverter mainly includes a combined inverter and an integrated inverter. With the more and more requirements for a distributed power station, the combined inverter plays a more and more important role in the distributed power station. The combined inverter has advantages such as a wide voltage range from 250V to 800V, flexible component configuration, a small volume, light weight, convenient transportation, easy installation, small floor space, therefore, construction difficult of the combined inverter in various applications is low, and the combined inverter can be installed without a lifting apparatus.

However, as the power of the combined inverter is increased, the weight of the combined inverter becomes heavier and heavier, and the advantages of the combined inverter such as the flexible installation and convenient transportation are diminished, which does not facilitate installation and transportation in the construction site, and reduces applicability of the combined inverter having high power.

In view of the disadvantages of the combined inverter described above, it is urgent to provide a combined inverter which can achieve flexible installation and transportation.

SUMMARY

In order to solve the technical problems described above, an objective of the present disclosure is to provide a combined inverter, which includes at least two box bodies connected detachably, to place all components of the combined inverter into the box bodies respectively, so as to effectively dismantle weight of the whole combined inverter, and greatly reduce construction difficult of installation and transportation, and improve applicability of the combined inverter having high power.

In order to achieve the objective of the present disclosure, the present disclosure provides a combined inverter, which includes at least two separate box bodies connected detachably, where all components of the combined inverter are placed into the box bodies separately;

at least one electrical connection terminal is arranged outside each of the box bodies, and the electrical connection terminal of one of the box bodies is capable of being connected to the electrical connection terminal of another of the box bodies.

Since the combined inverter includes multiple box bodies connected detachably, the weight of the box bodies included in the combined inverter is light to effectively dismantle the weight of the whole combined inverter, the box bodies are installed successively in a construction process to achieve a structure connection for the combined inverter, and the electrical connection terminals of the box bodies are connected to each other, to achieve an electrical connection for the combined inverter, thereby ensuring normal operation of the combined inverter.

In this way, a process of installing the combined inverter having big weight is changed into a process of successively installing the box bodies having light weight, thereby reducing construction difficult since the combined inverter is installed without a lifting apparatus. In addition, since the box bodies can be transported separately, the combined inverter in the embodiment has high applicability in a case of high power.

Optionally, the combined inverter according to the embodiment further includes a connector, and the box bodies are connected detachably via the connector.

Optionally, all the box bodies are arranged side by side, and a clamping plate extending in a side-by-side arrangement direction is provided for the connector, and a clamping groove is provided for each of the box bodies connected to the connector, the clamping groove of the box body is clamped with the clamping plate in the side-by-side arrangement direction.

Optionally, a first baffle and a second baffle are arranged respectively at two terminals of the clamping plate in the side-by-side arrangement direction, and the first baffle and the second baffle are used to limit relative sliding between the clamping groove and the clamping plate in the side-by-side arrangement direction at an installation position of the box body.

Optionally, a preset gap exists between the first baffle and/or the second baffle and the clamping plate, to enable a side wall of the clamping groove to slide to the installation position along the preset gap.

Optionally, a third baffle matched with the first baffle and the second baffle is provided for the clamping groove of the box body at the installation position; and bolt holes are opened in the first baffle, the second baffle and the third baffle, to connect the first baffle to the third baffle and connect the second baffle to the third baffle via bolts.

Optionally, multiple fixing holes are arranged onto a back surface of the connector facing toward a wall surface or a supporter, to fix the connector onto the wall surface or the supporter.

Optionally, a first clamping track and a second clamping track are arranged respectively at connection positions of adjacent two of the box bodies, and the first clamping track is clamped with the second clamping track.

Optionally, the first clamping track and the second clamping track are arranged respectively onto back surfaces of the adjacent two of the box bodies facing toward the wall surface or the supporter, and one of the first clamping track and the second clamping track extends towards the other of the first clamping track and the second clamping track.

Optionally, the first clamping track and the second clamping track are arranged respectively at connection faces of the box bodies where the box bodies contact with each other, to enable the first clamping track and the second clamping track to be located between the box bodies.

Optionally, the box bodies are arranged up and down, and the electrical connection terminal is arranged at a side of each of the box bodies in a same direction.

Optionally, the box bodies are arranged left and right, and the electrical connection terminal is arranged onto a bottom surface of each of the box bodies.

BRIEF DESCRIPTION OF THE DRAWINGS

In FIG. 1 to FIG. 6:
1 first box body, 11 first clamping groove, 12 first clamping track, 13 first electrical connection terminal, 14 magnetic component, 15 radiator;
2 second box body, 21 second clamping groove, 22 second clamping track, 23 second electrical connection terminal, 231 cable, 232 cable fixing head;
3 connector, 31 clamping plate, 32 first baffle, 33 second baffle, 34 fixing hole;
4 third baffle, 5 third box body;
A preset gap.

DETAILED DESCRIPTION

In order to better understand the technical solutions of the present disclosure by those skilled in the art, the present disclosure is illustrated in detail below in conjunction with the drawings and the embodiments.

In an existing combined inverter, as the power of the combined inverter is increased, the weight of the combined inverter becomes heavier and heavier, therefore, advantages of the combined inverter such as flexible installation and convenient transportation are diminished, which does not facilitate installation and transportation in the construction site, and reduces applicability of the combined inverter having high power.

Figure 1:
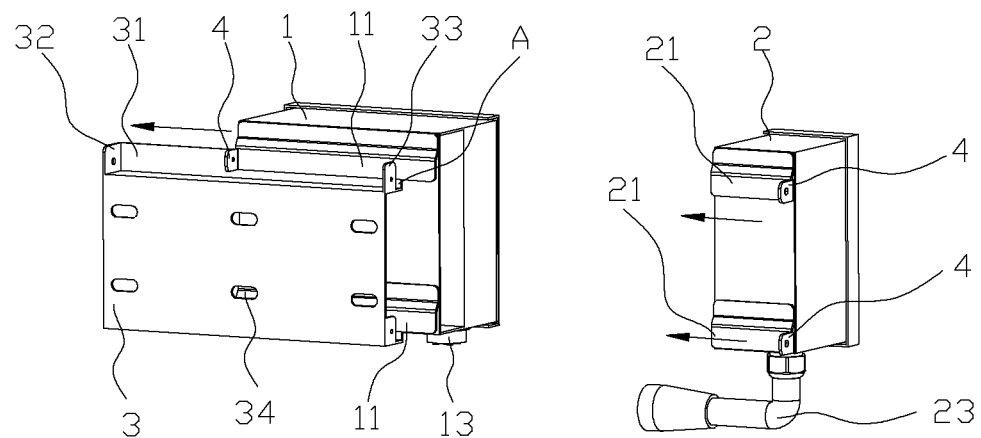
FIG. 1 is a schematic diagram of an installation process for a combined inverter according to a first embodiment in the present disclosure.

Reference is made to FIG. 1, which is a schematic diagram of an installation process for a combined inverter according to a first embodiment in the present disclosure.

In an embodiment of the present disclosure, a combined inverter is provided, which includes at least two separate box bodies connected detachably. All components of the combined inverter are placed into the box bodies separately, and at least one electrical connection terminal is arranged outside each of the box bodies, and the electrical connection terminal of one of the box bodies is capable of being connected to the electrical connection terminal of another of the box bodies.

Since the combined inverter includes multiple box bodies connected detachably, the weight of the box bodies included in the combined inverter is light, to effectively dismantle weight of the whole combined inverter, and all box bodies are installed successively in a construction process, to achieve a structure connection for the combined inverter; and electrical connection terminals of the box bodies are connected to each other, to achieve an electrical connection for the combined inverter, thereby ensuring normal operation of the combined inverter.

In this way, a process of installing the combined inverter having big weight is changed into a process of successively installing the box bodies having light weight, thereby reducing construction difficult since the combined inverter is installed without a lifting apparatus. In addition, since the box bodies can be transported separately, the combined inverter in the embodiment has high applicability in a case of high power.

It should be illustrated that since the combined inverter is used to convert a direct current into an alternating current, the combined inverter has two groups of external connection terminals, one group of external connection terminals is connected to an external device for providing the direct current, and the other group of external connection terminals is connected to an external device for using the alternating current converted by the combined inverter. The electrical connection terminal in the embodiments are used to connect components of the box bodies, and as the electrical connection terminals inside the combined inverter, are not connected to the external device, which is different from the two groups of external connection terminals in the conventional technology.

Specifically, the combined inverter further includes a connector 3. The connector 3 is detachably connected to a box body adjacent to the connector 3, and the combined inverter described above is configured by connecting the box bodies via the connector 3.

It should be illustrated that the combined inverter according to the embodiment may include any number of box bodies. For convenient installation and transportation, the number of box bodies are increased as the power of the combined inverter is increased, two box bodies is taken as an example herein. In addition, words such as 'first', 'second' herein do not indicate an installation order of the box bodies, but also do not represent difference between the box bodies. In fact, structures of the box bodies in the present disclosure may be the same or different, which can be arranged according to an actual condition in the installation process.

The combined inverter according to the embodiment shown in FIG. 1 includes two box bodies, i.e., a first box body 1 and a second box body 2. An inverter unit, a filtering unit, a control unit, a converging unit, a booster unit, a communication unit, a switch fitting and other components are placed into the two box bodies respectively, so that weight of each of the box bodies is light. The first box body 1 and the second box body 2 are installed onto a connector 3 in an installation process, and a lifting apparatus is not required in the installation process; and the first box body 1 and the second box body 2 are transported separately in a transportation process.

In the installation process, in order to balance weight of all box bodies, weight of all units may be allocated to the box bodies equally as much as possible.

More specifically, as shown in FIG. 1, the box bodies are arranged side by side, a clamping plate 31 extending in a side-by-side arrangement direction is provided for the connected 3, and a clamping groove is provided for the box body connected to the connector 3. In FIG. 1, a first clamping groove 11 is provided for the first box body 1, a second clamping groove 21 is provided for the second box body 2, and the first clamping groove 11 and the second clamping groove 21 are clamped with the clamping plate 31 successively in the side-by-side arrangement direction described above, to achieve a detachable connection of the first box body 1 and the connector 3 and a detachable connection of the second box body 2 and the connector 3.

It can be understood that a detachable connection manner between the box bodies and the connector 3 is not limited to the clamping manner, and may also be other manners commonly used in the art, for example, a pin connection manner or a bolt connection manner. Compared with the pin connection manner or the bolt connection manner, the connection manner in the embodiment may not result in great stress concentration of the box bodies when opening the hole, thereby ensuring strength of the box body.

Furthermore, a first baffle 32 and a second baffle 33 are arranged respectively at two terminals of the clamping plate 31 in the side-by-side arrangement direction described above. The first baffle 32 and the second baffle 33 described above limit relative sliding between the clamping groove and the clamping plate 31 in the side-by-side arrangement direction described above at the installation position of the box body, and further prevent the first clamping groove 11 and the second clamping groove 21 from sliding out of the clamping plate 31, thereby improving reliability of connections between the first box body 1 and the connector 3 and between the second box body 2 and the connector 3.

Specifically, in the embodiment shown in FIG. 1, the side-by-side arrangement direction described above is a direction from right to left, as a direction shown by an arrow in FIG. 1.

In addition, a preset gap A exists between the first baffle 32 and/or the second baffle 33 and the clamping plate 31, to enable the first clamping groove 11 and the second clamping groove 21 to slide to the installation position described above in the side-by-side arrangement direction described above within the preset gap A. In the embodiment shown in FIG. 1, in a process of installing the first box body 1 and the second box body 2, a side wall of the first clamping groove 11 and a side wall of the second clamping groove 21 successively slide through the preset gap A described above in the direction shown by the arrow in FIG. 1, and then enter into a clamping plate groove configured by the clamping plate 31, the first baffle 32 and the second baffle 33, to achieve the detachable connection.

It can be understood that no preset gap A described above exists between the first baffle 32 and the clamping plate 31 and between the second baffle 33 and the clamping plate 31, and the first baffle 32 and the second baffle 33 are connected to the clamping plate 31 directly. In this case, the side wall of the first clamping groove 22 and the side wall of the second clamping groove 21 are placed into the clamping plate groove described above from the upper edge of the first clamping plate 31. Operation of the installation process is easier by setting the preset gap A in the embodiment.

Furthermore, a third baffle 4 matched with the first baffle 32 and the second baffle 33 is provided for the first clamping groove 11 and the second clamping groove 21 at installation positions of the box bodies. In the embodiment shown in FIG. 1, the third baffle 4 is arranged at a left side of the first clamping groove 11, and a third baffle 4 is arranged at a right side of the second clamping groove 21.

Bolt holes are opened in the first baffle 32, the second baffle 33 and the third baffle 4, to connect the first baffle 32 to the third baffle 4 and connect the second baffle 33 to the third baffle 4 via holts, thereby further improving the reliability of the connections of the first box body 1 and the connector 3 and between the second box body 2 and the connector 3.

In practice, other detachable connection manners such as a pin connection manner commonly used in the art may be used between the first baffle 32 and the third baffle 4 and between the second baffle 33 and the third baffle 4, which is not limited here.

In the embodiment shown in FIG. 1, the size of the clamping plate 31 is not less than a sum of the size of the side wall of the first clamping groove 11 and the size of the side wall of the second clamping groove 21 in the direction of side-by-side arrangement direction described above. A length of the connector 3 is equal to a sum of a length of the first box body 1 and a length of the second box body 2 without taking account of an error.

Furthermore, in the embodiment shown in FIG. 1, the connector 3 is in a structure of rectangle, and multiple fixing holes 34 are opened on a back surface of the connector 3, to install the connector 3 onto a wall surface, and to further install the first box body 1 and the second box body 2 onto the wall surface.

In the embodiment, the back surface of the connector 3 is located at an external side of the first box body 1 and the second box body 2, various connection structures can be configured for the connector 3, to ensure reliability of a connection between the connector 3 and the wall surface.

In another embodiment, the connector 3 is located between two adjacent box bodies, the first clamping plate and the second clamping plate are arranged respectively at two sides of the connector 3 facing toward the first box body 1 and the second box body 2, and the first clamping groove and the second clamping groove described above are provided respectively for the first box body 1 and the second box body 2. The first clamping plate is clamped with the first clamping groove, and the second clamping plate is clamped with the second clamping groove.

Figure 2:
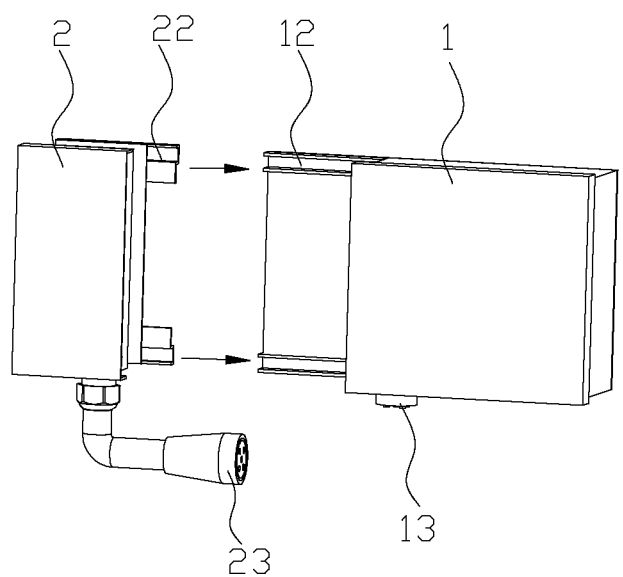
FIG. 2 is a schematic diagram of an installation process for a combined inverter according to a second embodiment in the present disclosure.
Figure 3:
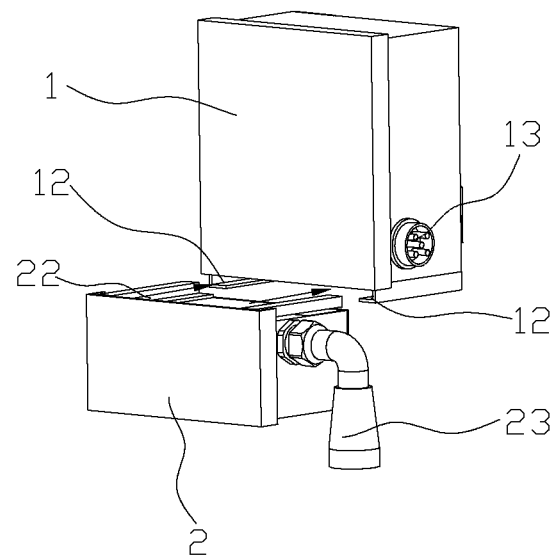
FIG. 3 is a schematic diagram of an installation process for a combined inverter according to a third embodiment in the present disclosure.
Figure 4:
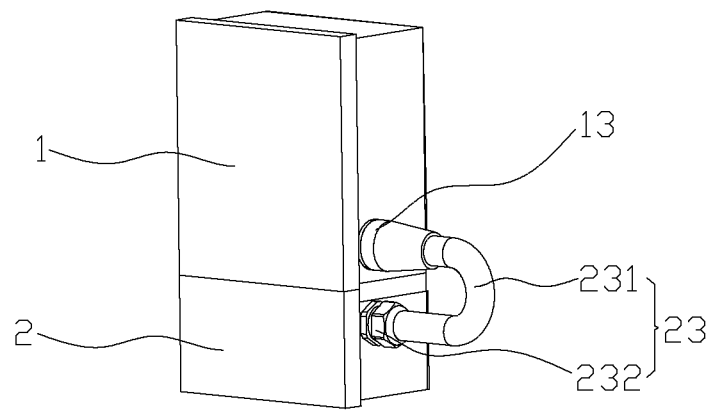
FIG. 4 is a schematic structural diagram of a combined inverter after all components in FIG. 3 are installed.

Reference is made to FIG. 2 to FIG. 4, FIG. 2 is a schematic diagram of an installation process for a combined inverter according to a second embodiment in the present disclosure, FIG. 3 is a schematic diagram of an installation process for a combined inverter according to a third embodiment in the present disclosure, and FIG. 4 is a schematic structural diagram for a combined inverter after all components in FIG. 3 are installed.

In the second embodiment, a first clamping track 12 and a second clamping track 22 are arranged respectively at connection positions of two adjacent box bodies, and the first clamping track 12 and the second clamping track 22 are arranged oppositely, to clamp the first clamping track 12 with the second clamping track 22, and the clamping plate is connected to the two box bodies permanently in this case. In the embodiment, a connector 3 is not required, and the detachable connection can be achieved only by the clamping plate in the box body.

In the embodiment shown in FIG. 2, the first clamping track 12 is fixed onto a back surface of the first box body 1 facing toward the wall surface, and the second clamping track 22 is fixed onto a back surface of the second box body 2 facing toward the wall surface. The first clamping track 12 extends towards the second clamping track 22, and an extension length of the first clamping track 12 is equal to a length of the second clamping track 22, to clamp the first clamping track 12 with the second clamping track 22.

In installing the box bodies, the second box body 2 slides toward the first box body 1, the first clamping track 12 is matched with the second clamping track 22, the side wall of the first box body 1 may contact the side wall of the second box body 2, thereby realizing the detachable connection of the first box body 1 and the second box body 2.

In a third embodiment, the first clamping track 12 and the second clamping track 22 are located between two adjacent box bodies, and are fixed at connection faces of the box bodies where the two adjacent box bodies contact with each other. In the embodiment as shown in FIG. 3, the first box body 1 and the second box body 2 are arranged up and down, the first clamping track 12 is arranged at a bottom surface of the first box body 1, the second clamping track 22 is arranged at a top surface of the second box body 2, and the first clamping track 12 and the second clamping track 22 are arranged oppositely.

It should be illustrated that, in the embodiments described above, the box bodies are not limited to be arranged up and down or left and right, and may be arranged in a combination manner of up and down and left and right. For example, in a case that the combined inverter includes three box bodies, a first box body and a second box body may be arranged left and right, and both the first box body and the second box body are arranged up and down relative to a third box body. Therefore, a structure of the combined inverter in the present disclosure does not limit a relative position relation of all box bodies, and the relative position relation of all box bodies may be set based on actual installation requirements.

Figure 5:
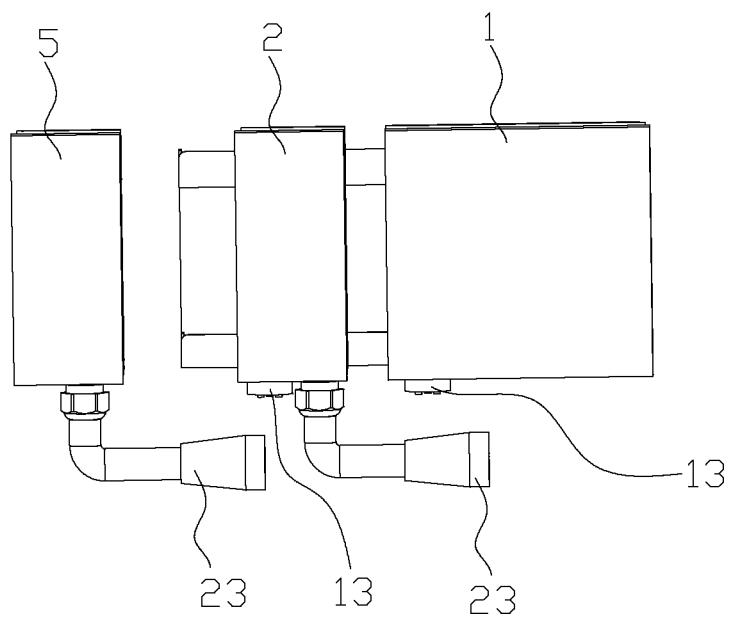
FIG. 5 is a schematic diagram of an installation process for a combined inverter according to a fourth embodiment in the present disclosure.
Figure 6:
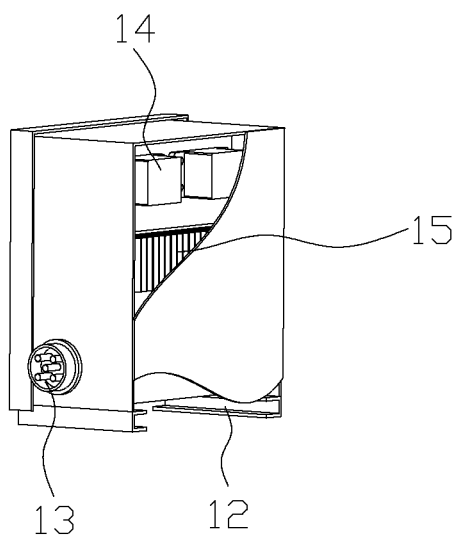
FIG. 6 is a schematic structural diagram of a box body in FIG. 1.

Reference is made to FIG. 5 and FIG. 6, FIG. 5 is a schematic diagram of an installation process for a combined inverter according to a fourth embodiment in the present disclosure, and FIG. 6 is a schematic structural diagram of a box body in FIG. 1.

In the embodiments described above, a structure connection between all box bodies are achieved by the clamping plate, and the combined inverter is configured by connecting all box bodies. An electrical connection between all box bodies is required in addition to the structure connection, in order to ensure normal operation of the inverter.

Based on this, an electrical connection terminal is provided for the box body, and the electrical connection terminals can be connected to each other, to achieve the electrical connection between all box bodies.

In the embodiments shown in FIG. 1 and FIG. 2, in a case that the box bodies are arranged left and right, a first electrical connection terminal 13 is arranged onto a lower surface of the first box body 1, and a second electrical connection terminal 23 is arranged onto a lower surface of the second box body 2. The first electrical connection terminal 12 is connected to the second electrical connection terminal 23 after the structure connection of the first box body 1 and the second box body 2 is achieved, to achieve the electrical connection of the first box body 1 with the second box body 2.

In practice, the two electrical connection terminals described above are not limited to be arranged at the bottom of the box body, and may also be arranged onto any one surface of the box body. An influence of snow and rain on the electrical connection terminal may be prevented in a case that the electrical connection terminal is arranged at the bottom of the box body, thereby improving protection grade, and it is beneficial to user operation in a case that the electrical connection terminal is arranged at the bottom of the box body.

In a case that the box bodies are arranged up and down, as shown in FIG. 3 and FIG. 4, the two electrical connection terminals are arranged at a side of the box body, the two electrical connection terminals are connected to each other after the structure connection of the box bodies is achieved, to achieve the electrical connection. In a case that a connection face of the first box body 1 is located at a bottom surface of the first box body 1, and a connection face of the second box body 2 is located at a top surface of the second box body 2, connection process of the two electrical connection terminals is difficult in a case that the first electrical connection terminal 13 is arranged at the bottom surface of the first box body 1 and the second electrical connection terminal 23 is arranged at the top surface of the second box body 2, and the first electrical connection terminal 13 is aligned with the second electrical connection terminal 23 while the first clamping track 12 is matched with the second clamping track 22, which increases operation difficult for the box body. Therefore, the two electrical connection terminals are arranged at a side of the box body in the embodiment.

In the embodiments above, the second electrical connection terminal 23 includes a cable 231 and a cable fixing head 232. The cable 231 is electrically connected to the first electrical connection terminal 12, and the cable fixing head 232 electrically connects the cable 231 to the second box body 2. Since the cable 231 can be bent, connection between the two electrical connection terminals is easily implemented, and arrangement position of the box body is flexible.

In the embodiment shown in FIG. 5, the combined inverter includes a first box body 1, a second box body 2 and a third box body 5 which are connected detachably. A second electrical connection terminal 23 of the third box body 5 may be electrically connected to a first electrical connection terminal 13 of the first box body 1 or the second box body 2, that is, in a case that the combined inverter includes more than two box bodies, it is not limited that electrical connection terminals of adjacent box bodies are connected to each other, but electrical connection terminals of any box bodies can be electrically connected to each other.

In another aspect, in the embodiments described, as shown in FIG. 6, a magnetic component 14 and a radiator 15 are arranged inside the first box body 1 and/or the second box body 2.

The combined inverter according to the present disclosure is introduced in detail above. A specific example is used in the present disclosure to describe the principle and the embodiments of the present disclosure, the embodiments described above are only used to assist in understanding the method and the core concept of the present disclosure. It should be noted that, improvements and modifications may also be made by those skilled in the art without departing from the principle of the disclosure. Those improvements and modifications should also be included in the scope of protection of the disclosure.

The invention claimed is:

1. A combined inverter, comprising: at least two separate box bodies connected detachably, wherein
   all components of the combined inverter are placed into the box bodies separately,
   at least one electrical connection terminal is arranged outside each of the box bodies, and the electrical connection terminal of one of the box bodies is capable of being connected to the electrical connection terminal of another of the box bodies; and
   a connector, wherein the box bodies are connected detachably via the connector;
   wherein a plurality of fixing holes are arranged onto a back surface of the connector facing toward a wall surface or a supporter, to fix the connector onto the wall surface or the supporter.

2. The combined inverter according to claim 1, wherein the box bodies are arranged side by side, and a clamping plate extending in a side-by-side arrangement direction is provided for the connector, and a clamping groove is provided for each of the box bodies connected to the connector, the clamping groove of the box body is clamped with the clamping plate in the side-by-side arrangement direction.

3. The combined inverter according to claim 2, wherein a first baffle and a second baffle are arranged respectively at two terminals of the clamping plate in the side-by-side arrangement direction, and the first baffle and the second baffle are used to limit relative sliding between the clamping groove and the clamping plate in the side-by-side arrangement direction at an installation position of the box body.

4. The combined inverter according to claim 3, wherein a preset gap exists between the first baffle and/or the second baffle and the clamping plate, to enable a side wall of the clamping groove to slide to the installation position along the preset gap.

5. The combined inverter according to claim 3, wherein a third baffle matched with the first baffle and the second baffle is provided for the clamping groove of the box body at the installation position; and
bolt holes are opened in the first baffle, the second baffle and the third baffle, to connect the first baffle to the third baffle and connect the second baffle to the third baffle via bolts.

6. The combined inverter according to claim 4, wherein a third baffle matched with the first baffle and the second baffle is provided for the clamping groove of the box body at the installation position; and
bolt holes are opened in the first baffle, the second baffle and the third baffle, to connect the first baffle to the third baffle and connect the second baffle to the third baffle via bolts.

7. The combined inverter according to claim 1, wherein the first clamping track and the second clamping track are arranged respectively onto back surfaces of the adjacent two of the box bodies facing toward the wall surface or the supporter, and one of the first clamping track and the second clamping track extends towards the other of the first clamping track and the second clamping track.

8. The combined inverter according to claim 1, the first clamping track and the second clamping track are arranged respectively at connection faces of the box bodies where the box bodies contact with each other, to enable the first clamping track and the second clamping track to be located between the box bodies.

9. The combined inverter according to claim 1, wherein the box bodies are arranged left and right, and the electrical connection terminal of each of the box bodies is arranged onto a bottom surface of each of the box bodies.

* * * * *